(12) United States Patent
Son

(10) Patent No.: US 10,191,790 B2
(45) Date of Patent: Jan. 29, 2019

(54) DATA STORAGE DEVICE AND ERROR RECOVERY METHOD THEREOF

(71) Applicant: SK hynix Inc., Gyeonggi-do (KR)

(72) Inventor: Ik Joon Son, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/644,241

(22) Filed: Jul. 7, 2017

(65) Prior Publication Data

US 2018/0225185 A1  Aug. 9, 2018

(30) Foreign Application Priority Data

Feb. 9, 2017 (KR) ........................ 10-2017-0018073

(51) Int. Cl.
| | |
|---|---|
| G06F 11/07 | (2006.01) |
| G06F 11/20 | (2006.01) |
| G06F 11/10 | (2006.01) |
| G11C 29/52 | (2006.01) |
| G06F 11/14 | (2006.01) |
| G11C 29/04 | (2006.01) |

(52) U.S. Cl.
CPC .......... *G06F 11/07* (2013.01); *G06F 11/1068* (2013.01); *G06F 11/14* (2013.01); *G06F 11/2094* (2013.01); *G11C 29/52* (2013.01); *G06F 2201/805* (2013.01); *G06F 2201/82* (2013.01); *G11C 2029/0409* (2013.01); *G11C 2029/0411* (2013.01)

(58) Field of Classification Search
CPC ............ G06F 11/2094; G06F 11/1068; G06F 2201/82; G06F 2201/805; G11C 29/52
See application file for complete search history.

(56) References Cited

U.S. PATENT DOCUMENTS

| | | | | |
|---|---|---|---|---|
| 2009/0138754 A1* | 5/2009 | Edwards | ............... | G06F 9/4403 714/6.11 |
| 2011/0138222 A1* | 6/2011 | Haines | ................ | G06F 11/1048 714/6.12 |
| 2013/0055046 A1* | 2/2013 | Blodgett | ............... | G06F 11/106 714/764 |
| 2015/0279485 A1* | 10/2015 | Weksler | ................ | G11C 29/10 714/720 |

FOREIGN PATENT DOCUMENTS

KR  1020150039000  4/2015

* cited by examiner

*Primary Examiner* — Ajay Ojha
(74) *Attorney, Agent, or Firm* — IP & T Group LLP

(57) ABSTRACT

A data storage device includes a nonvolatile memory device including a memory block having a plurality of memory regions; and a controller suitable for searching a first memory region for which error correction is passed, by scanning the plurality of memory regions in a reverse order of a write sequence for the memory block, determining a target memory region in the memory block based on data stored in the first memory region, and performing a recovery operation for the target memory region.

18 Claims, 11 Drawing Sheets

DATA STORAGE DEVICE AND ERROR RECOVERY METHOD THEREOF

CROSS-REFERENCES TO RELATED APPLICATION

The present application claims priority under 35 U.S.C. § 119(a) to Korean application number 10-2017-0018073, filed on Feb. 9, 2017, in the Korean Intellectual Property Office, which is incorporated herein by reference in its entirety.

BACKGROUND

1. Technical Field

Various embodiments generally relate to a data storage device, and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices may be embedded in an external device during manufacturing of the external device or may be fabricated separately and then connected afterwards to an external device.

SUMMARY

In an embodiment, a data storage device may include: a nonvolatile memory device including a memory block having a plurality of memory regions, and a controller suitable for searching a first memory region for which error correction is passed, by scanning the plurality of memory regions in a reverse order of a write sequence for the memory block, determining a target memory region in the memory block based on data stored in the first memory region, and performing a recovery operation for the target memory region.

In an embodiment, a method for operating a data storage device may include: searching a first memory region for which error correction is passed by scanning a plurality of memory regions included in a memory block, in a reverse order of a write sequence for the memory block; determining a target memory region in the memory block based on data stored in the first memory region; and performing a recovery operation for the target memory region.

BRIEF DESCRIPTION OF THE DRAWINGS

The above and other features and advantages of the present invention will become more apparent to those skilled in the art to which the present invention belongs by describing various embodiments thereof with reference to the attached drawings in which.

DETAILED DESCRIPTION

Figure 1:
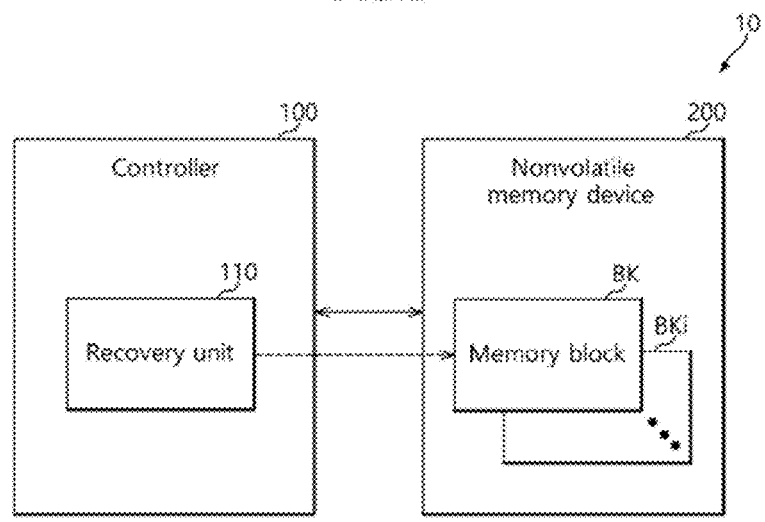
FIG. 1 is a block diagram illustrating a data storage device in accordance with an embodiment.

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being between two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art, and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a data storage device 10 in accordance with an embodiment.

The data storage device 10 may be configured to store data provided from an external device, in response to a write request from the external device. Also, the data storage device 10 may be configured to provide stored data to the external device, in response to a read request from the external device.

The data storage device 10 may be configured by a Personal Computer Memory Card International Association (PCMCIA) card, a Compact Flash (CF) card, a smart media card, a memory stick, various multimedia cards (for example, MMC, eMMC, RS-MMC, and MMC-Micro) various secure digital cards (for example SD, Mini-SD, and Micro-SD), a Universal Flash Storage (UFS) a Solid State Drive (SSD) and the like.

The data storage device 10 may include a controller 100 and a nonvolatile memory device 200.

The controller 100 may store data in memory blocks BK to BKi of the nonvolatile memory device 200 in response to a write request received from the external device, and may read data stored in the nonvolatile memory device 200 and output read data to the external device in response to a read request received from the external device.

The controller 100 may include a recovery unit 110.

The recovery unit 110 may perform a recovery operation for at least one memory block BK in the nonvolatile memory device 200, when a sudden power-off occurs in the data storage device 10. One portion of the memory block BK stores data and the other portion of the memory block BK is still empty. In the present embodiment, the recovery operation may be performed to copy data varied by the sudden power-off in the memory block BK, to another memory region of the same memory block BK. Also, in order to allow a recovery operation interrupted due to repetition of the sudden power-off, to resume, the recovery unit 110 may store the progress information of the recovery operation as transaction data, that is, transaction-begin data and transaction-done data.

The recovery unit 110 may search a memory region for which error correction is passed, by scanning sequentially a plurality of memory regions included in the memory block BK, in a reverse order of a write sequence for the memory block BK, determine a target memory region in the memory block BK based on the data stored in the memory regions, and perform a recovery operation for the target memory region in the memory block BK. Further, when performing the recovery operation, the recovery unit 110 may write dummy data in an initially erased memory region of the memory block BK, write transaction-begin data in a first subsequent memory region, copy the data stored in the target memory region to a second subsequent memory region and write transaction-done data in a third subsequent memory region. In the write sequence, the first subsequent memory region is subsequent to the initially erased memory region, the second subsequent memory region is subsequent to the first subsequent memory region, and the third subsequent memory region is subsequent to the second subsequent memory region.

The transaction-begin data may include information on the target memory region for which the recovery operation is performed. The transaction-done data may represent that the recovery operation is completely done. Therefore, even though the sudden power-off is repeated, the recovery unit 110 may figure out whether a previous recovery operation is interrupted or is completely done, through the transaction-begin data and the transaction-done data, and resume the interrupted recovery operation.

A method for the recovery unit 110 to determine a target memory region in the memory block BK among a plurality of memory blocks BK to BKi in the nonvolatile memory device 200 and perform the recovery operation will be described below in detail through drawings.

The nonvolatile memory device 200 may store data received from the controller 100 according to control of the controller 100. Also, the nonvolatile memory device 200 may read stored data and transmit read-out data to the controller 100, according to control of the controller 100 The nonvolatile memory device 200 may include the plurality of memory blocks BK to BKi.

The nonvolatile memory device 200 may include a flash memory (for example, a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

While FIG. 1 illustrates one nonvolatile memory device 200, it is to be noted that, according to an embodiment, the data storage device 10 may include at least two nonvolatile memory devices.

Figure 2:
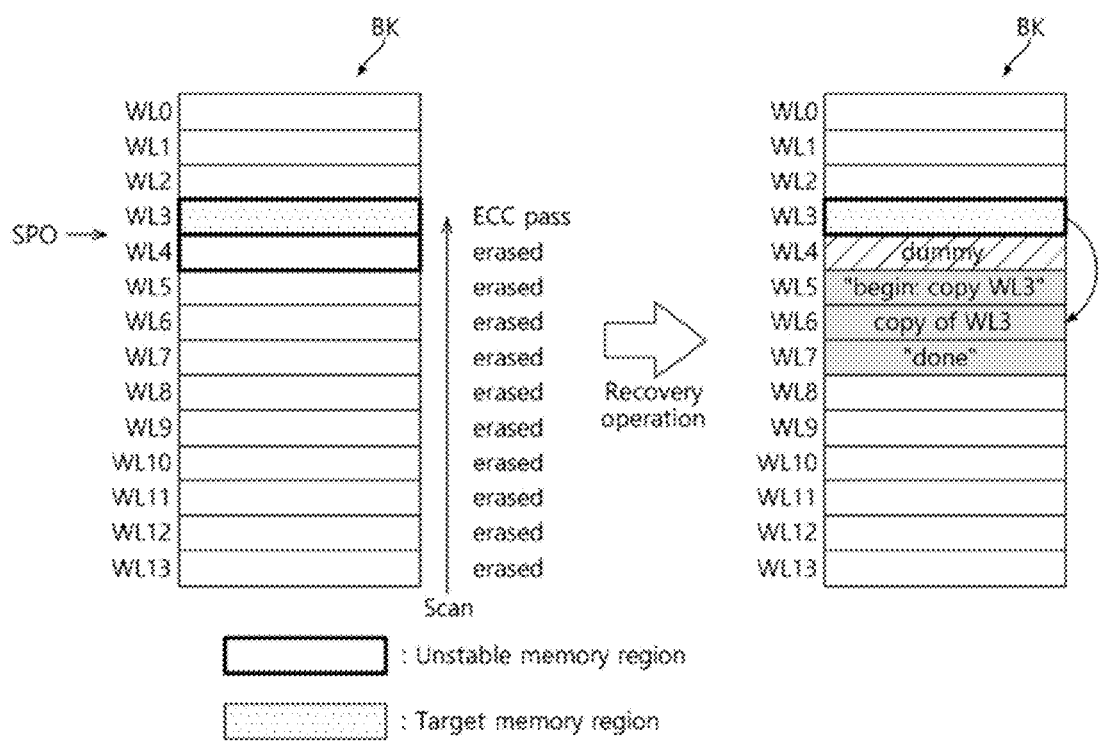
FIG. 2 is a diagram illustrating a recovery operation of a recovery unit in accordance with an embodiment.

FIG. 2 is a diagram illustrating a recovery operation of the recovery unit 110 of FIG. 1. FIG. 2 illustrates a method for searching a target memory region WL3 which is in an unstable state due to a sudden power-off SPO and performing a recovery operation for the target memory region WL3 in the memory block BK.

The memory block BK may it elude a plurality of memory regions WL0 to WL13. The respective memory regions WL0 to WL13 may be accessed through corresponding word lines. Each of the memory regions WL0 to WL3 may include a plurality of memory cells. In the memory block BK, data may be stored in a predetermined write sequence, for example, sequentially from the memory region WL0 to the memory region WL13. Each memory region may include a plurality of memory units depending on the number of bits to be stored in each memory cell. A memory unit may be, for example, page. For example, when i number of bits are stored in each memory cell, each memory region may include i number of pages.

When the sudden power-off SPO occurs after data is written in the memory region WL3, the recovery unit 110 may search an initially erased memory region WL4 and the target memory region WL3 in the memory block BK. For example, the recovery unit 110 may perform a scan operation in a reverse order of the write sequence for the memory block BK, that is, from the memory region WL13 to the memory region WL0. The scan operation may include a read operation for a memory region and an error correction operation for read data. Therefore, immediately after finding the erased memory region WL4 through the scan, if error correction for the memory region WL3 is passed, the recovery unit 110 may determine the memory region WL4 as an initially erased memory region, and determine the memory region WL3 as a target memory region. According to the present embodiment, a target memory region for the recovery unit 110 may be a memory region which is searched immediately after an initially erased memory region and for which error correction is passed.

The memory region WL3 is determined as a target memory region of a recovery operation since even though error correction for the memory region WL3 is passed, the memory region WL3 may be in an unstable state due to the sudden power-off SPO. For example, when a write operation that is being performed for the target memory region WL3 is not perfectly finished because of the sudden power-off SPO, passage of error correction for the target memory region WL3 may not be always ensured. Even the initially erased memory region WL4 may be in an unstable state by being influenced by disturbance due to the sudden power-off SPO Even though the initially erased memory region WL4 is determined to be in an erased state, the initially erased memory region WL4 may be in an unstable state if a write operation was slightly performed for the initially erased memory region WL4 almost immediately before the sudden power-off SPO.

Thus, the recovery unit 110 may perform the recovery operation for the target memory region WL3, by using the memory regions WL4 to WL7. Since the memory region WL4 which is in an unstable state is not appropriate to store data, the recovery unit 110 may perform a dummy write operation by writing dummy data in the memory region WL4. Then, the recovery unit 110 may perform a transaction-begin write operation by writing in the memory region WL5 transaction-begin data representing that a copy operation for the target memory region WL3 is to be performed. The recovery unit 110 may perform a copy operation by copying the data stored in the target memory region WL3 to the memory region WL6. The recovery unit 110 may perform a transaction-done write operation by writing in the memory region WL7, transaction-done data representing that the copy operation is done. According to an embodiment, the recovery unit 110 may mark in the memory regions WL5 and WL7, that the transaction-begin and transaction-done write operations have been performed.

Figure 3:
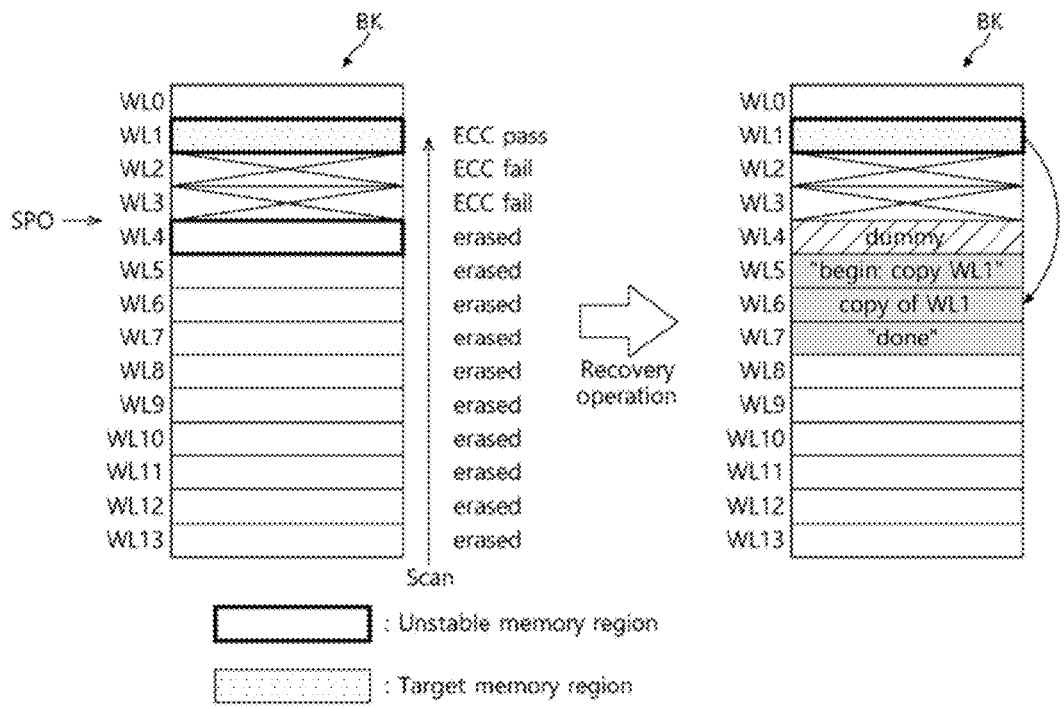
FIG. 3 is a diagram illustrating a recovery operation of the recovery unit in accordance with an embodiment.
Figure 4:
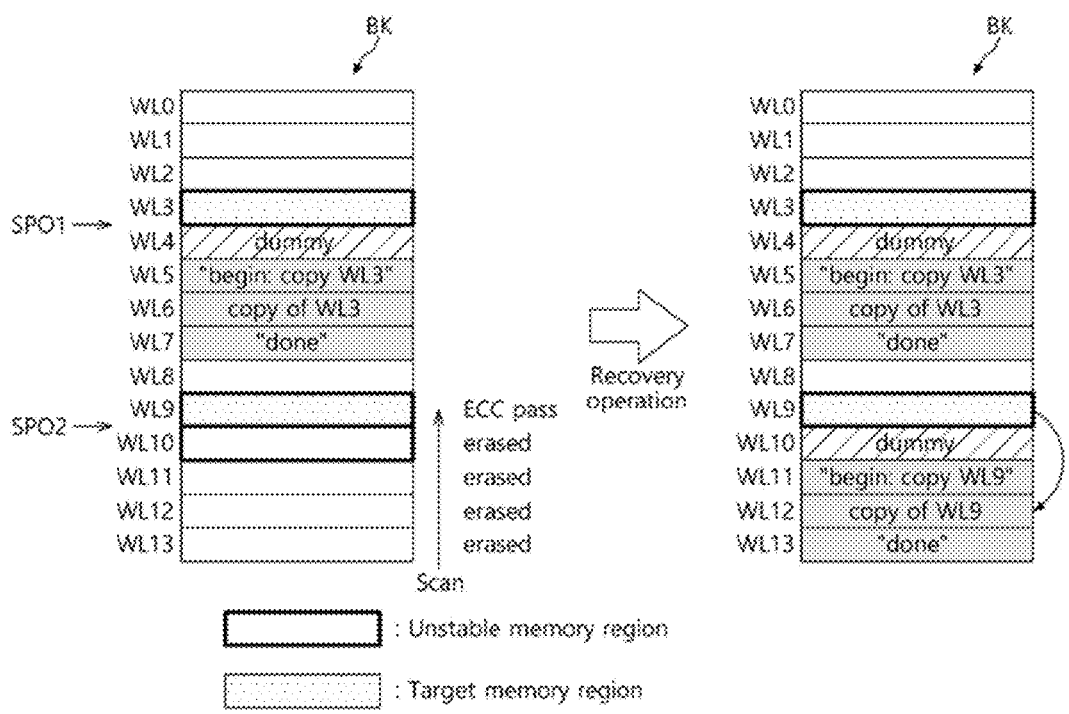
FIG. 4 is a diagram illustrating an example of a recovery operation of the recovery unit in accordance with an embodiment.

FIG. 4 is a diagram illustrating a recovery operation of the recovery unit 110 of FIG. 1. FIG. 3 illustrates a method for determining a target memory region WL1 of a recovery operation, depending on a result of error correction.

When a sudden power-off SPO occurs, the recovery unit 110 may scan the memory block BK in the reverse order of the write sequence, that is, from the memory region WL13 to the memory region WL0. Immediately after an erased memory region WL4 is found, if a memory region WL3 which stores data is found, the recovery unit 110 may determine the erased memory region WL4 as an initially erased memory region. However, since error correction for the memory regions WL2 and WL3 failed, the recovery unit 110 may continue the scan operation in the reverse order of the write sequence for the memory block BK. As a result, the recovery unit 110 may find a memory region WL1 for which error correction is passed, and determine the memory region WL1 as a target memory region of a recovery operation. The target memory region WL1 and the initially erased memory region WL4 may be in an unstable state due to the sudden power-off SPO, as described above.

Thus, the recovery unit 110 may perform the recovery operation for the target memory region WL1, by using the memory regions WL4 to WL7, as described above with reference to FIG. 2. That is, the recovery unit 110 may sequentially perform a dummy write operation a transaction-begin write operation a copy operation for the target memory region WL1 and a transaction-done write operation, for the memory regions WL4 to WL7, respectively.

FIG. 4 is a diagram illustrating a recovery operation of the recovery unit 110 of FIG. 1. FIG. 4 illustrates a method for performing a recovery operation when sudden power-offs SPO1 and SPO2 occur repeatedly.

Referring to FIG. 4, first, consideration may be made for a case where a recovery operation is performed, by using the memory regions WL4 to WL7, for the memory region WL3 which becomes unstable due to the sudden power-off SPO1. Then, after the recovery operation is perfectly done, a write operation is performed for the memory regions WL8 and WL9 and the sudden power-off SPO2 occurs.

If the sudden power-off SPO2 occurs, the recovery unit 110 may search an initially erased memory region WL10 and a target memory region WL9 for which error correction is passed, by scanning the memory block BK as described above. The target memory region WL9 and the initially erased memory region WL10 may be in an unstable state due to the sudden power-off SPO2.

Thus, the recovery unit 110 may perform a recovery operation for the target memory region WL9, by using the memory regions WL10 to WL13. That is, the recovery unit 110 may sequentially perform a dummy write operation, a transaction-begin write operation, a copy operation for the target memory region WL9 and a transaction-done write operation, for the memory regions WL10 to WL13, respectively.

Even though the sudden power-offs SPO1 and SOP2 occur repeatedly, if a previous recovery operation is perfectly done already, a subsequent recovery operation may be performed in the same manner according to the method described above.

Now, consideration may be made for a situation where a sudden power-off occurs repeatedly while a previous recovery operation is being performed. To handle such a situation, the recovery unit 110 may determine whether the previous recovery operation has been interrupted, by determining whether transaction-begin data is scanned after an initially erased memory region is searched. First, the recovery unit 110 may search an initially erased memory region and a memory region for which error correction is passed first, by scanning the memory block BK in the reverse order of the write sequence. If data for which error correction is passed is transaction-begin data, the recovery unit 110 may determine that a recovery operation for a memory region indicated by the transaction-begin data has been interrupted. Moreover, even though data for which error correction is passed is not transaction-begin data, the recovery unit 110 may determine whether the data for which error correction is passed is one which is written through a copy operation in a previous recovery operation. Therefore, the recovery unit 110 may further check whether transaction-begin data is stored before the data for which error correction is passed.

Hereinbelow, examples of a method for determining a target memory region and resuming a recovery operation when a previous recovery operation is interrupted will be described through various situations with reference to FIGS. 5 to 9.

Figure 5:
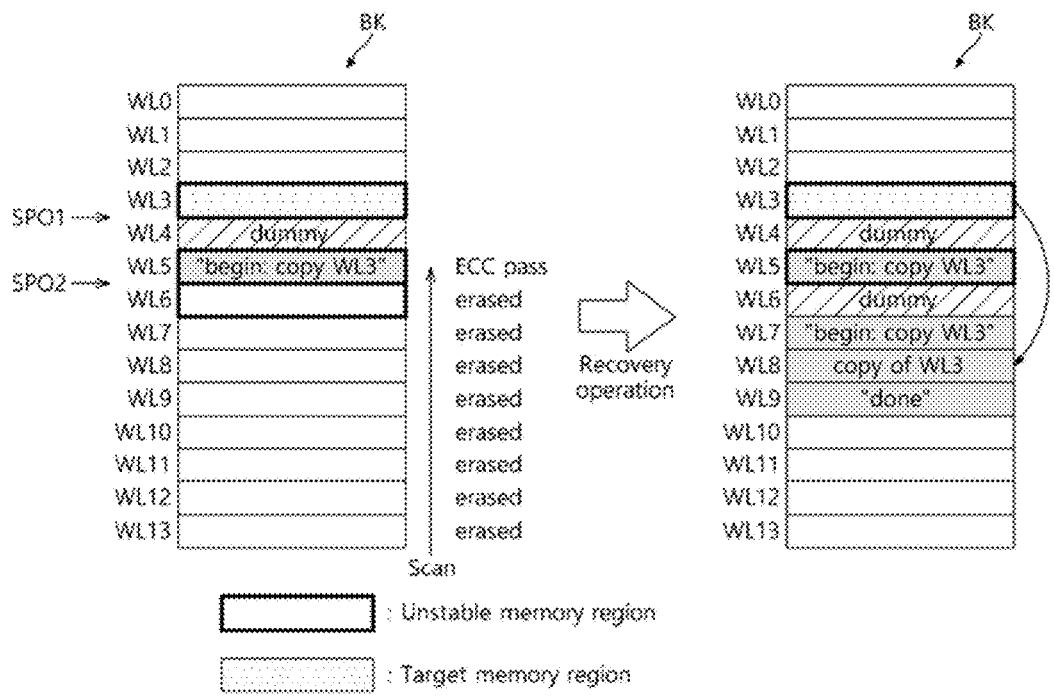
FIG. 5 is a diagram illustrating an example of a recovery operation of the recovery unit in accordance with an embodiment.

FIG. 5 is a diagram illustrating an example of a recovery operation of the recovery unit 110 of FIG. 1. FIG. 5 illustrates when the memory region WL3 is in an unstable state due to a sudden power-off SPO1 and, while a recovery operation for the target memory region WL3 is being performed by using the memory regions WL4 to WL7, a sudden power-off SPO2 occurs after only a dummy write operation and a transaction-begin write operation are performed for the memory regions WL4 and WL5, respectively.

The recovery unit 110 may detect the sudden power-off SPO2, and search an initially erased memory region WL6 and a memory region WL5 for which error correction is passed, by scanning the memory block BK as described above. Therefore, the recovery unit 110 may determine, through the transaction-begin data stored in the memory region WL5, that the recovery operation for the target memory region WL3 has been interrupted due to the sudden power-off SPO2. Thus, the recovery unit 110 may again perform the recovery operation for the target memory region WL3, by using the memory regions WL6 to WL9. That is, the recovery unit 110 may sequentially perform a dummy write operation, a transaction-begin rite operation a copy operation for the target memory region WL3 and a transaction-done write operation, for the memory regions WL6 to WL9, respectively.

According to the present embodiment, if a memory region which is searched immediately after an initially erased memory region and for which error correction is passed stores transaction-begin data, a target memory region for the recovery unit 110 may be a memory region which is indicated by the corresponding transaction-begin data. In this case, a recovery operation may be performed in the same manner as described above with reference to FIG. 2.

Figure 6:
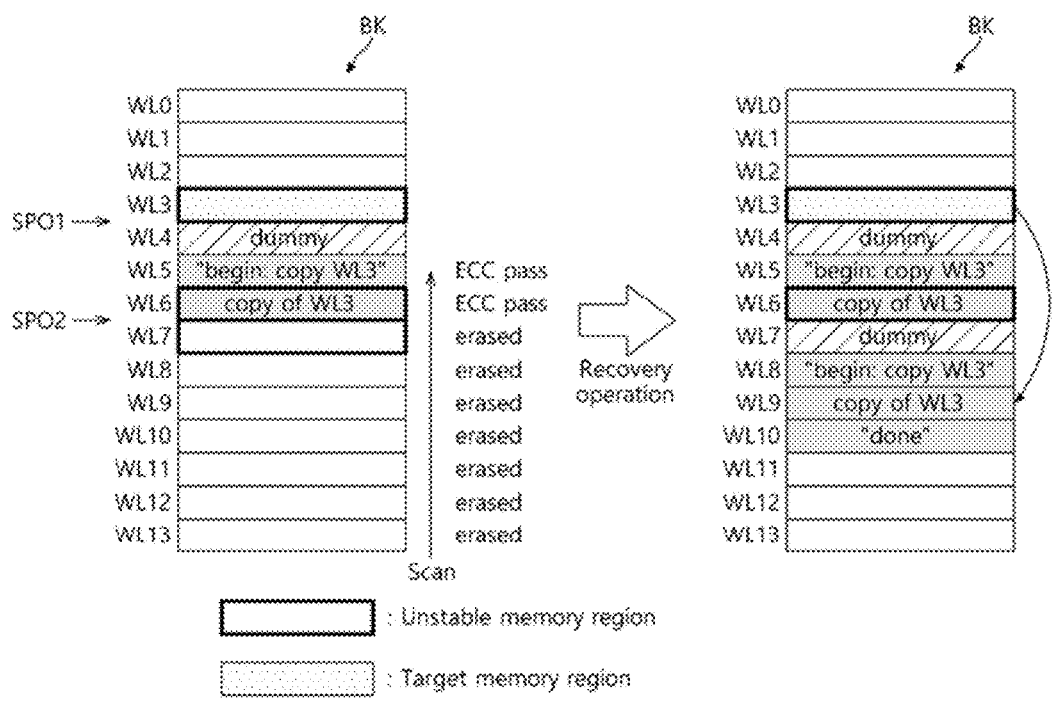
FIG. 6 is a diagram illustrating an example of a recovery operation of the recovery unit in accordance with an embodiment.

FIG. 6 is a diagram illustrating an example of a recovery operation of the recovery unit 110 of FIG. FIG. 6 illustrates when the memory region WL3 is in an unstable state due to a sudden power-off SPO1 and, while, a recovery operation for the target memory region WL3 is being performed by using the memory regions WL4 to WL7 a sudden power-off SPO2 occurs after only a dummy write operation, a transaction-begin write operation and a copy operation for the target memory region WL are performed for the memory regions WL4 to WL6, respectively.

The recovery unit 110 may detect the sudden power-off SPO2, and search an initially erased memory region WL7 and a memory region WL6 for which error correction is passed, by scanning the memory block BK as described above. To determine whether the memory region WL6 has been used for a copy operation in a previous recovery operation, the recovery unit 110 may scan the memory region WL5. If the memory region WL5 is passed in error correction and stores transaction-begin data, the recovery unit 110 may determine through the transaction-begin data stored in the memory region WL5 that the memory region WL6 has been used for a copy operation in a recovery operation for the target memory region WL3 and the corresponding recovery operation has been interrupted.

Thus, the recovery unit 110 may resume the recovery operation for the target memory region WL3 by using the memory regions WL7 to WL10. That is, the recovery unit 110 may sequentially perform a dummy write operation, a transaction-begin write operation, a copy operation for the target memory region WL3 and a transaction-done write operation, for the memory regions WL7 to WL10, respectively.

According to the present embodiment, when a first memory region which is searched immediately after an initially erased memory region and for which error correction is passed stores normal data that data other than dummy data, transaction-begin data and transaction-gone data, if a second memory region which is searched immediately after the first memory region and for which error correction is passed stores transaction-begin data, a target memory region for the recovery unit 110 may be a memory region which is indicated by the corresponding transaction-begin data.

Figure 7:
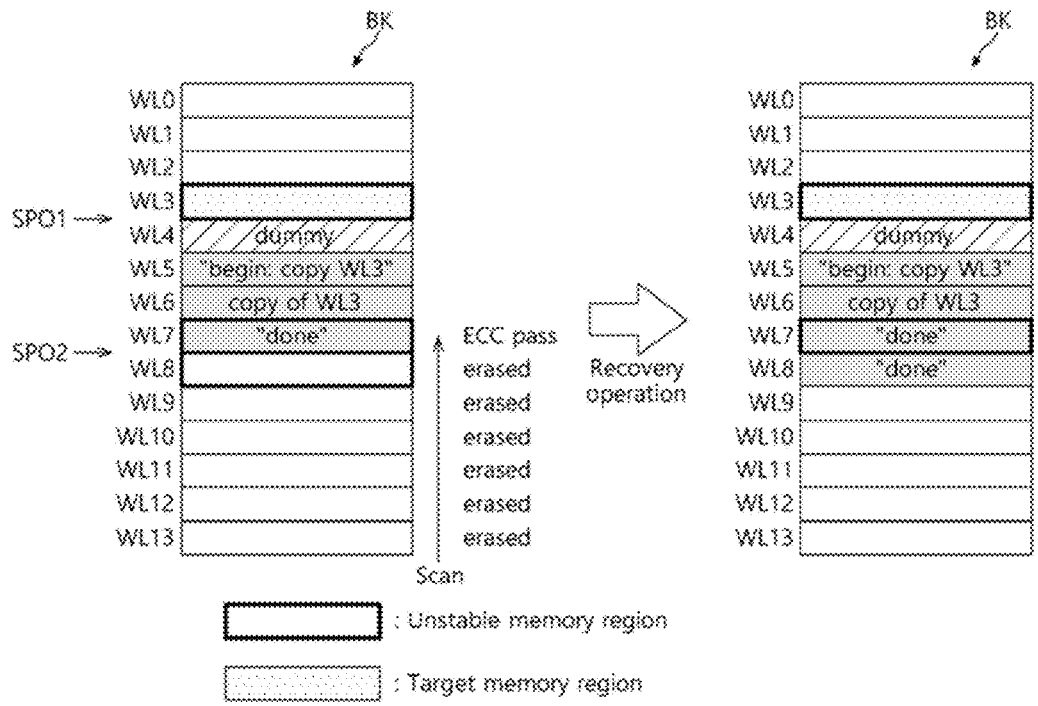
FIG. 7 is a diagram illustrating an example of a recovery operation of the recovery unit in accordance with an embodiment.

FIG. 7 is a diagram illustrating an example of a recovery operation of the recovery unit 110 of FIG. 1. FIG. 7 illustrates when the memory region WL3 is in an unstable state due to a sudden power-off SPO1, and a sudden power-off SPO2 occurs after a recovery operation for the target memory region WL3 that is, a dummy write operation, a transaction-begin write operation, a copy operation for the target memory region WL3 and a transaction-done write operation are performed for the memory regions WL4 to WL7.

The recovery unit 110 may detect the sudden power-off SPO2, and search an initially erased memory region WL8 and a memory region WL7 for which error correction is passed, by scanning the memory block BK as described above. Therefore, the recovery unit 110 may determine, through the transaction-done data stored in the memory region WL7 that the recovery operation for the target memory region WL3 has been completed already.

Thus, without performing a copy operation, in order to ensure only that the initially erased memory region WL8 which is unstable is not used, the recovery unit 110 may perform only a transaction-done write operation for the memory region WL8. According to an embodiment, the recovery unit 110 may perform a dummy write operation for the memory region WL8.

FIGS. 5 to 7 illustrate cases in which memory regions next to initially erased memory regions are passed in error correction. In the case in which error correction for corresponding memory regions is failed, the recovery unit 110 may continue scanning in the reverse order of the write sequence for the memory block BK until a memory region for which error correction is passed is found, as illustrated in FIG. 3, and perform a recovery operation depending on whether data for which error correction is passed is normal data, transaction-begin data or transaction-done data.

Figure 8:
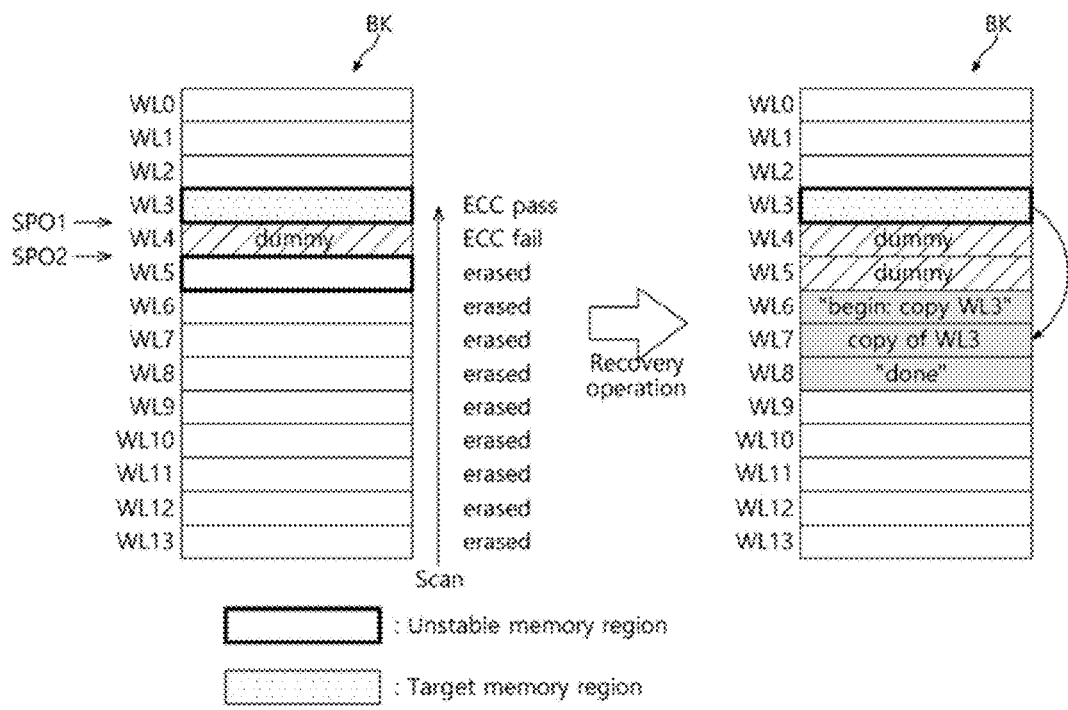
FIG. 8 is a diagram illustrating an example of a recovery operation of the recovery unit in accordance with an embodiment.

FIG. 8 is a diagram illustrating an example of a recovery operation of the recovery unit 110 of FIG. 1. FIG. 8 illustrates when the memory region WL3 is in an unstable state due to a sudden power-off SPO1 and, while a recovery operation for the target memory region WL3 is being performed by using the memory regions WL4 to WL7, a sudden power-off SPO2 occurs after only a dummy write operation is performed for the memory region WL4.

The recovery unit 110 may detect the sudden power-off SPO2, and search an initially erased memory region WL5 and a target memory region WL3 for which error correction is passed, by scanning the memory block BK as described above. That is, the recovery unit 110 may be failed in error correction for the memory region WL4 where dummy data is written and thus continue to scan in a direction toward the target memory region WL3.

Thus, the recovery unit 110 may again perform the recovery operation for the target memory region WL3, by using the memory regions WL5 to WL8. That is, the recovery unit 110 may sequentially perform a dummy write operation, a transaction-begin write operation, a copy operation for the target memory region WL3 and a transaction-done write operation, sequentially for the memory regions WL5 to WL8, respectively.

Since the previous recovery operation for the target memory region WL3 has been interrupted due to the sudden power-off SPO2 even before transaction-begin data is stored, the recovery unit 110 may not be aware of the fact that the recovery operation for the target memory region WL3 has been interrupted. However, the recovery unit 110 may resume the recovery operation for the target memory region WL3 by performing a scan of the target memory region WL3 through the memory region WL4 where dummy data is stored. In this case, the recovery operation illustrated in FIG. 8 may be performed in substantially the same manner as the recovery operation illustrated in FIG. 3.

Figure 9:
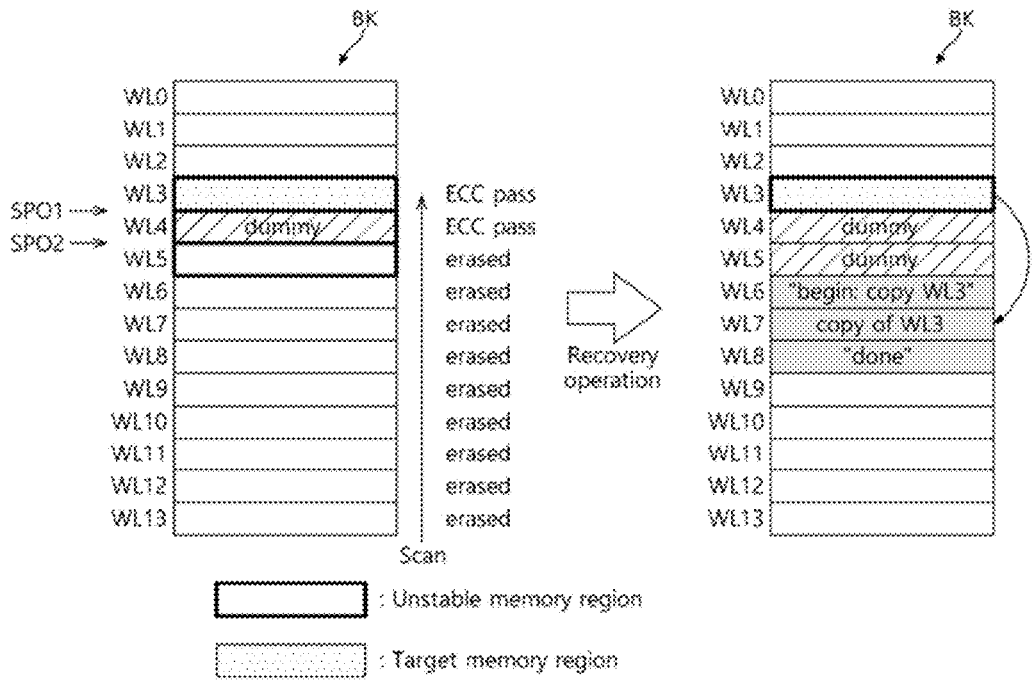
FIG. 9 is a diagram illustrating an example of a recovery operation of the recovery unit in accordance with an embodiment.

FIG. 9 is a diagram illustrating an example of a recovery operation of the recovery unit 110 of FIG. 1. FIG. 9 illustrates a case in which error correction for dummy data is passed in a situation the same as the situation illustrated in FIG. 8.

According to an embodiment, dummy data written through a dummy write operation may be generated to be able to be error-corrected.

The recovery unit 110 may detect the sudden power-off SPO2, and search an initially erased memory region WL5 and a memory region WL4 for which error correction is passed, by scanning the memory block BK as described above. The recovery unit 110 may determine that data for which error correction is passed is dummy data, and continue the scan operation for the memory region WL1 The recovery unit 110 may be passed in error correction for the memory region WL3, and determine the memory region WL3 as a target memory region.

Thus, the recovery unit 110 may perform the recovery operation for the memory region WL3 by using the memory regions WL5 to WL8 in the same manner as described above with reference to FIG. 8.

Figure 10:
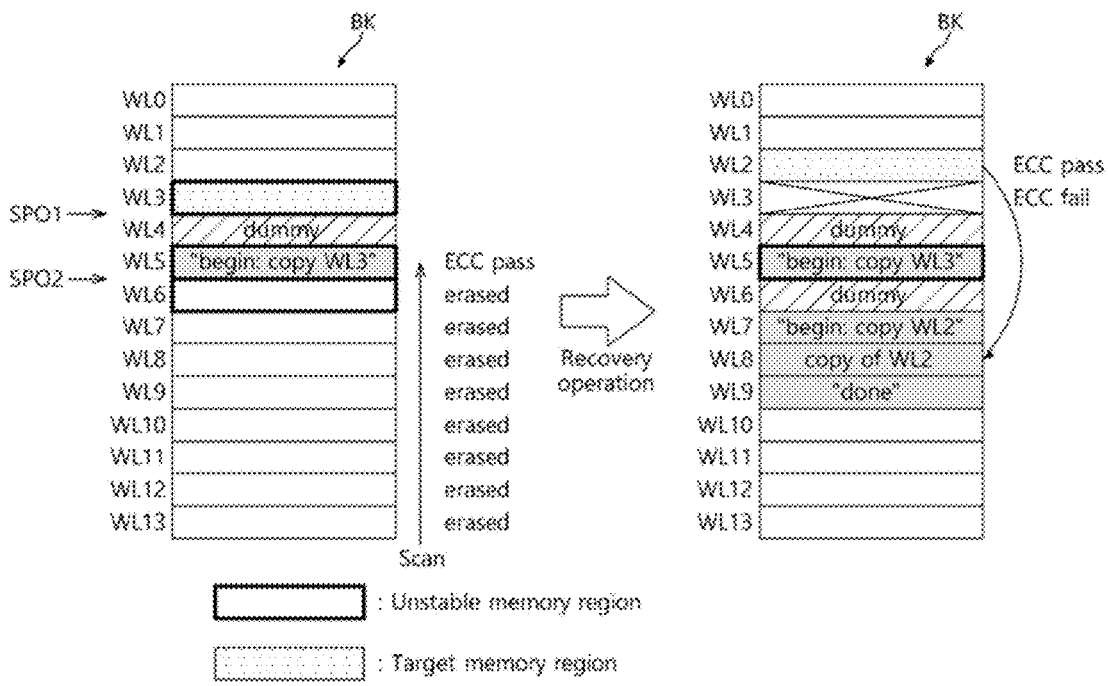
FIG. 10 is a diagram illustrating an example of a recovery operation of the recovery unit in accordance with an embodiment.

FIG. 10 is a diagram illustrating an example of a recovery operation of the recovery unit 110. FIG. 10 illustrates a case in which, at a time when an interrupted recovery operation for a target memory region WL3 is resumed, error correction for the target memory region W13 is failed.

Even though a situation where sudden power-offs SPO1 and SOP2 occur is the same as the situation of FIG. 5, since the target memory region WL3 is in an unstable state due to the initial sudden power-off SPO1, error correction for the target memory region WL3 may be failed at the time when the recovery operation is resumed, and thus, a copy operation may be impossible to perform.

In this case, the recovery unit 110 may determine that a memory region which is searched immediately after the target memory region WL3 and for which error correction is passed that is, a memory region WL2, is a new target, memory region. Therefore, the recovery unit 110 may sequentially perform a dummy write operation, a transaction-begin write operation, a copy operation for the target memory region WL2 and a transaction-done write operation, for the memory regions WL6 to WL9, respectively.

Figure 11:
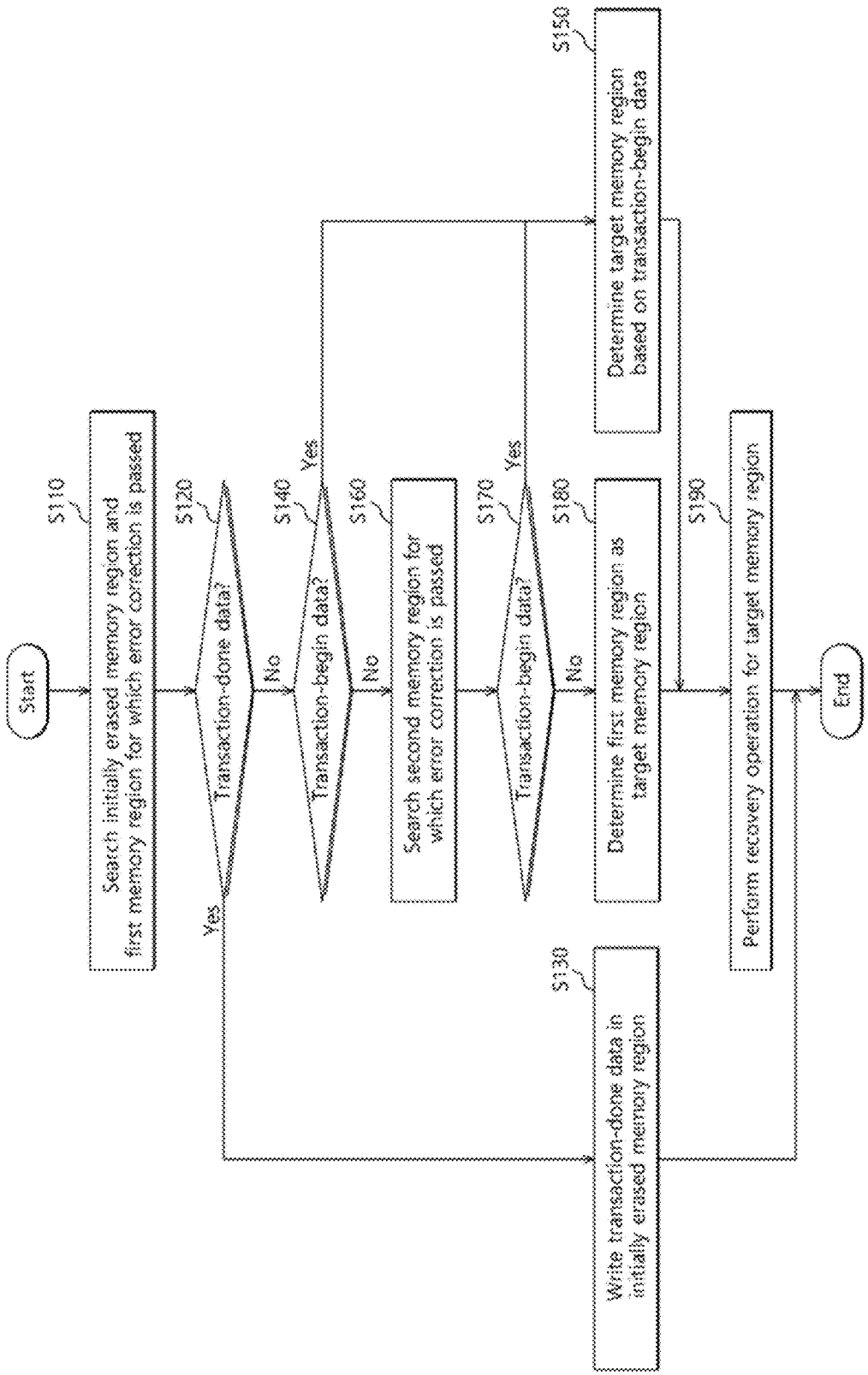
FIG. 11 is a flow chart illustrating a method for operating the data storage device in accordance with an embodiment.

FIG. 11 is a flow chart illustrating a method for operating the data storage device 10 of FIG. 1. FIG. 11 shows a method for searching an initially erased memory region and a target memory region in response to a sudden power-off and performing a recovery operation.

At step S110, the recovery unit 110 may search an initially erased memory region and a first memory region for which error correction is passed, by scanning the memory block BK in a reverse order of a write sequence for the memory block BK.

At step S120, the recovery unit 110 may determine whether transaction done data is stored in the first memory region. When it is determined that transaction-done data is stored in the first memory region, the process may proceed to step S130.

At the step S130, the recovery unit 110 may write transaction-done data in the initially erased memory region. That is, since it may be checked through the step S120 that a previous recovery operation is perfectly done, the recovery unit 110 may perform only a transaction-done write operation, without performing a copy operation, in such a way as to ensure only that the initially erased memory region is not used. Then, the process may be ended.

When it is determined at the step S120 that transaction-done data is not stored in the first memory region, the process may proceed to step S140.

At the step S140, the recovery unit 110 may determine whether transaction-begin data is stored in the first memory region. When it is determined that transaction-begin data is stored in the first memory region, the process may proceed to step S150.

At the step S150, the recovery unit 110 may determine a target memory region based on the transaction-begin data. Since the transaction-begin data indicates a target memory region of a previously interrupted recovery operation, the recovery unit 110 may determine the target memory region of the interrupted recovery operation as a target memory region of a current recovery operation.

When it is determined at the step S140 that transaction-begin data is not stored in the first memory region, the process may proceed to step S160. As a result, when it is determined that normal data is stored in the first memory region the process may proceed to the step S160.

At the step S160, the recovery unit 110 may search a second memory region for which error correction is passed, by continuously scanning the memory block BK in the reverse order of the write sequence for the memory block BK. The step S160 may be to determine whether transaction-begin data is written previously and thereby determine whether the first memory region has been used for a copy operation in a previous recovery operation.

At step S170, the recovery unit 110 may determine whether transaction-begin data is stored in the second memory region. When it is determined that transaction-begin data is stored in the second memory region, the recovery unit 110 may determine that the first memory region has been used for a copy operation in a previously interrupted recovery operation, and the process may proceed to the step S150. Accordingly, the recovery unit 110 may determine a target memory region of the interrupted recovery operation, as a target memory region of a current recovery operation.

When it is determined at the step S170 that transaction-begin data is not stored in the second memory region, the process may proceed to step S180. For example, when it is determined that transaction-done data or normal data is stored in the second memory region, the process may proceed to the step S180.

At the step S180, the recovery unit 110 may determine the first memory region as a target memory region.

At step S190, the recovery unit 110 may perform a recovery operation for the target memory region.

Figure 12:
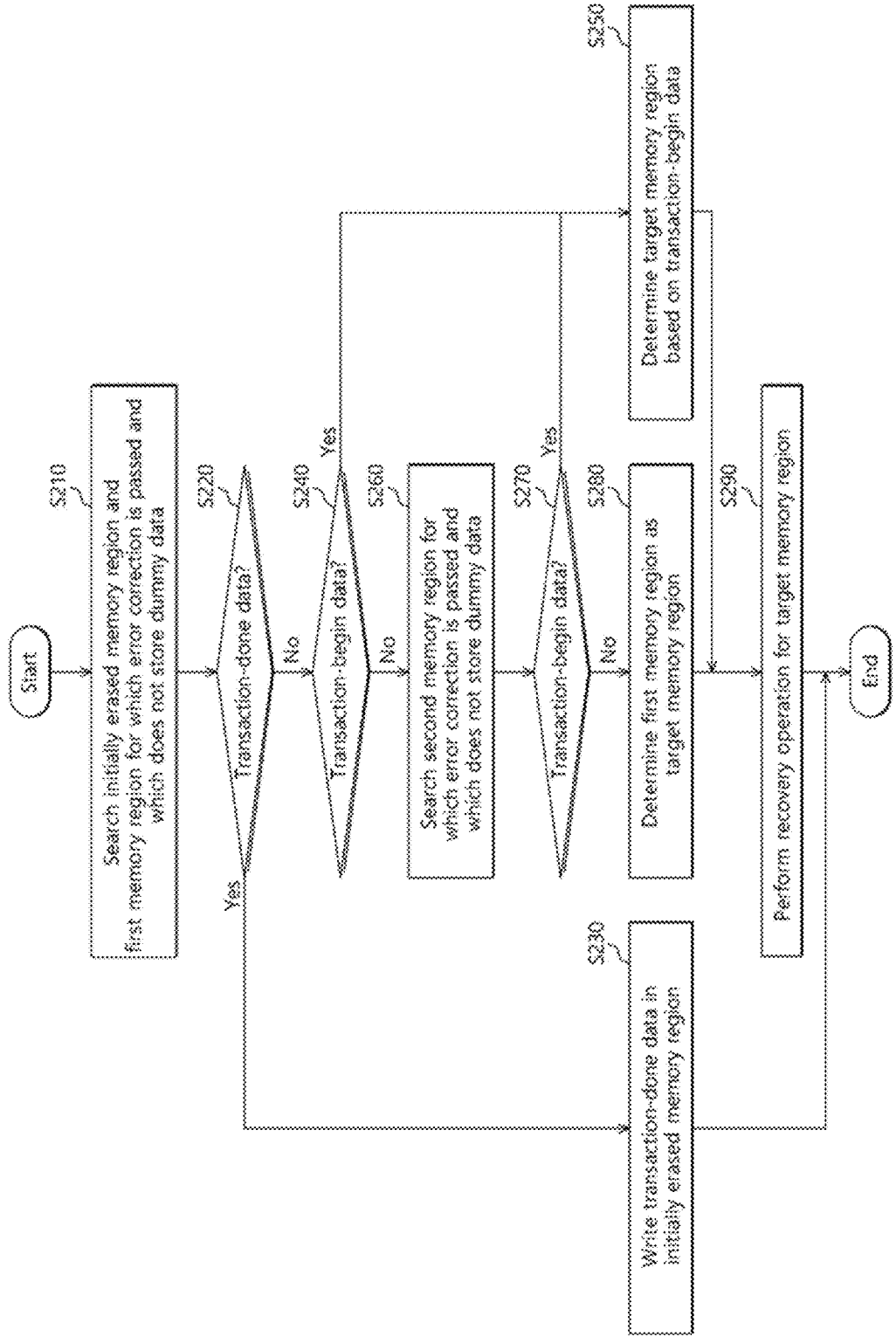
FIG. 12 is a flow chart illustrating a method for operating the data storage device in accordance with an embodiment.

FIG. 12 is a flow chart illustrating a method for operating the data storage device 10 of FIG. 1. FIG. 12 illustrates a method for performing a recovery operation when error correction for dummy data is possible as described above with reference to FIG. 9. In FIG. 12, since steps S220 to S250 and S270 to S290 except steps S210 and S260 are substantially the same as the steps S120 to S150 and S170 to S190 of FIG. 11, respectively, detailed descriptions thereof will be omitted herein, At the step S210, the recovery unit 110 may search an initially erased memory region and a first memory region for which error correction is passed and which does not store dummy data, by scanning the memory block BK in a reverse order of a write sequence for the memory block BK.

At the step S260, the recovery unit 110 may search a second memory region for which error correction is passed and which does not store dummy data, by continuously scanning the memory block BK in the reverse order of the write sequence for the memory block BK.

Figure 13:
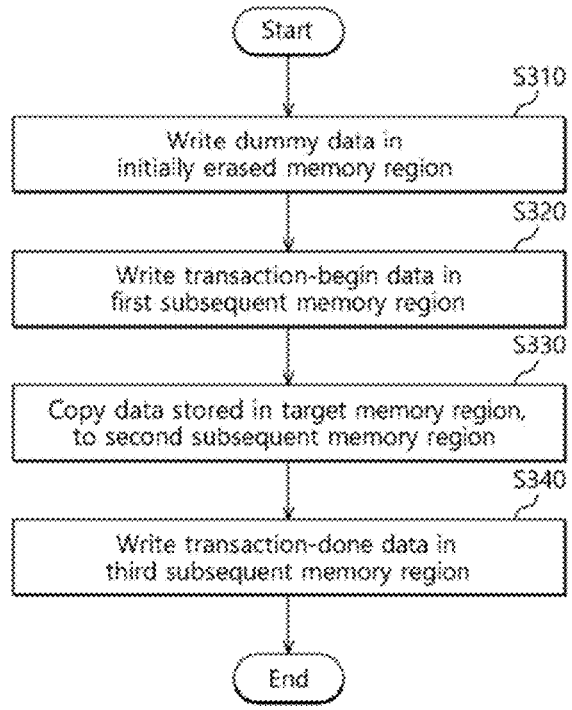
FIG. 13 is a flow chart illustrating a method for operating the data storage device in accordance with an embodiment.

FIG. 13 is a flow chart illustrating a method for operating the data storage device 10 of FIG. 1 in accordance with the embodiments FIG. 13 illustrates in detail a method for performing a recovery operation for a target memory region. FIG. 13 may be a detailed embodiment of the steps S190 and S290 of FIGS. 11 and 12, respectively.

At step S310, the recovery unit 110 may write dummy data in an initially erased memory region of a memory block. That is, since the initially erased memory region is in an unstable state due to a sudden power-off, the recovery unit 110 may prohibit the use of the initially erased memory region through a dummy write operation.

At step S320, the recovery unit 110 may write transaction-begin data in a first subsequent memory region which is subsequent to the initially erased memory region according to a write sequence for the memory block. The transaction-begin data may indicate a target memory region of a recovery operation.

At step S330, the recovery unit 110 may copy the data stored in the target memory region, to a second subsequent memory region which is subsequent to the first subsequent memory region according to the write sequence for the memory block BK.

At step S340, the recovery unit 110 may write transaction-done data in a third subsequent memory region which is subsequent to the second subsequent memory region according to the write sequence for the memory block BK. The transaction-done data may represent that the recovery operation is completely done.

Figure 14:
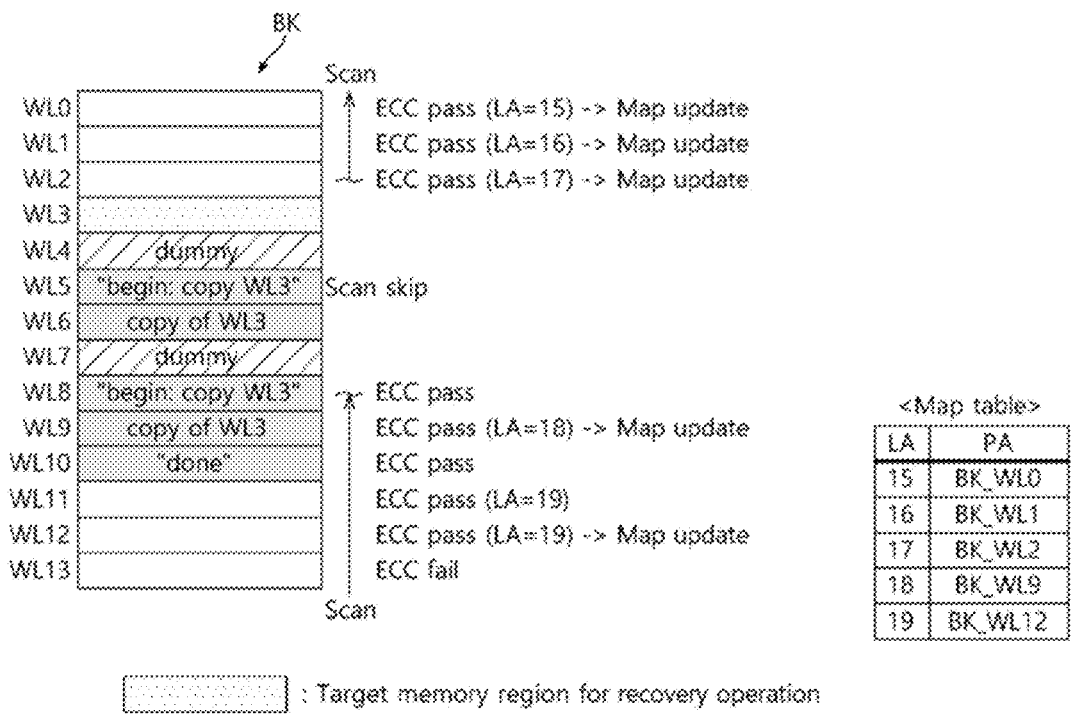
FIG. 14 is a diagram illustrating an example of a map update method of a controller in accordance with an embodiment.

FIG. 14 is a diagram illustrating an example of a map update method of the controller 100 of FIG. 1 in accordance with the embodiment.

The controller 100 may perform a map update for mapping a logical address LA and a physical address PA, in a map table. The controller 100 may store data and a logical address LA allocated to the data, together in a specified memory region of a memory block BK, in response to a write request received from an external device.

When the memory block BK does not include an empty memory region, the controller 100 may perform a map update by obtaining the logical address LA stored in the memory region and mapping the logical address LA with a physical address PA in the map table. Accordingly, in response to a read request from the external device for a specified logical address LA, the controller 100 may check a physical address PA mapped to the specified logical address LA, in the map table, and perform a read operation for the checked physical address PA.

When describing in detail a method of performing map update in consideration of a recovery operation in accordance with the embodiment, first, the controller 100 may search a memory region for which error correction is passed, by scanning the memory block BK in a reverse order of a write sequence for the memory block BK. For example, when error correction for the memory region WL13 is failed, the controller 100 may abandon the map update for the memory region WL13 and continue to perform a scan in a direction toward the memory region WL12.

If error correction for the memory region WL12 is passed, the controller 100 may check that error-corrected data is normal data, and obtain a logical address LA=19 stored in the memory region WL12.

Then, the controller 100 may check a physical address PA which is mapped to the logical address LA=19 in the map table, and determine whether the data stored in the memory region WL12 is recently stored data. If the logical address LA=19 has been mapped already to a certain memory region of the memory block BK in the map table, the data stored in the memory region WL12 may not be recently stored data. Otherwise, the data stored in the memory region WL12 is recently stored data, and the controller 100 may map the logical address LA=19 to a physical address BK_WL12 of the memory region WL12 in the map table.

The controller 100 may scan the memory region WL11, and error correction for the memory region WL11 may be passed. The controller 100 may check that normal data is stored in the memory region WL11, and obtain a logical address LA=19. The controller 100 may check a physical address PA which is mapped to the logical address LA=19 in the map table, and determine whether the data stored in the memory region WL11 is recently stored data. The controller 100 may check that the logical address LA=19 has been mapped already to the memory region WL12 of the memory block BK in the map table, and determine that the data stored in the memory region WL11 is not recently stored data. Accordingly, the controller 100 may not perform a map update for the memory region WL11.

The controller 100 may scan the memory region WL10, and error correction for the memory region WL10 may be passed. The controller 100 may check that transaction-done data is stored in the memory region WL10. Since the transaction-done data is not data write-requested from the external device, a map update for the memory region WL10 may not be needed.

The controller 100 may scan the memory region WL9, and error correction for the memory region WL9 may be passed. The controller 100 may check that normal data is stored in the memory region WL9, and obtain a logical address LA=18. The controller 100 may check a physical address PA which is mapped to the logical address LA=18 in the map table, and determine that the data stored in the memory region WL9 is recently stored data. The controller 100 may map the logical address LA=18 to a physical address BK_WL9 of the memory region WL9 in the map table.

The controller 100 may scan the memory region WL8, and error correction for the memory region WL8 may be passed. The controller 100 may check that transaction-begin data is stored in the memory region WL8. Since the transaction-begin data is not data write-requested from the external device, map update for the memory region WL8 may not be needed. The controller 100 may check a target memory region WL3 of a recovery operation based on the transaction-begin data, and skip the scan to the target memory region WL3. The memory regions WL3 to WL7 may be regions for which a map update is not needed according to the above-described recovery operation algorithm. In particular, since a copy operation for the target memory region WL3 makes the data stored in the memory region WL9 recently stored data, the target memory region WL3 may not need a map update.

Then, the controller 100 may scan the memory region WL2, and error correction for the memory region WL2 may be passed. The controller 100 may check that normal data is stored in the memory region WL2, and obtain a logical address LA=17. The controller 100 may check a physical address PA which is mapped to the logical address LA=17 in the map table, and determine that the data stored in the memory region WL2 is recently stored data. The controller 100 may map the logical address LA=17 to a physical address BK_WL2 of the memory region WL2 in the map table.

The controller 100 may scan the memory region WL1, and error correction for the memory region WL1 may be passed. The controller 100 may check that normal data is stored in the memory region WL1, and obtain a logical address LA=16. The controller 100 may check a physical address PA which is mapped to the logical address LA=16 in the map table, and determine that the data stored in the memory region WL1 is recently stored data. The controller 100 may map the logical address LA=16 to a physical address BK_WL1 of the memory region WL1 in the map table.

The controller 100 may scan the memory region WL0, and error correction for the memory region WL0 may be passed. The controller 100 may check that normal data is stored in the memory region WL0, and obtain a logical address LA=15. The controller 100 may check a physical address PA which is mapped to the logical address LA=15 in the map table, and determine that the data shred in the memory region WL0 is recently stored data. The controller 100 may map the logical address LA=15 to a physical address BK_WL0 of the memory region WL0 in the map table.

The controller 100 may complete a map update for the memory block BK, by completing a scan and map update to the initial memory region WL0 in the memory block BK.

According to an embodiment, the controller 100 may perform a map update for the memory block BK, while the memory block BK is being used, that is, although the memory block BK still includes an empty memory region. By performing a scan from the memory region WL13 in the reverse order of the write sequence for the memory block BK, the controller 100 may perform a map update for memory regions for which error correction is passed, by skipping erased memory regions.

Figure 15:
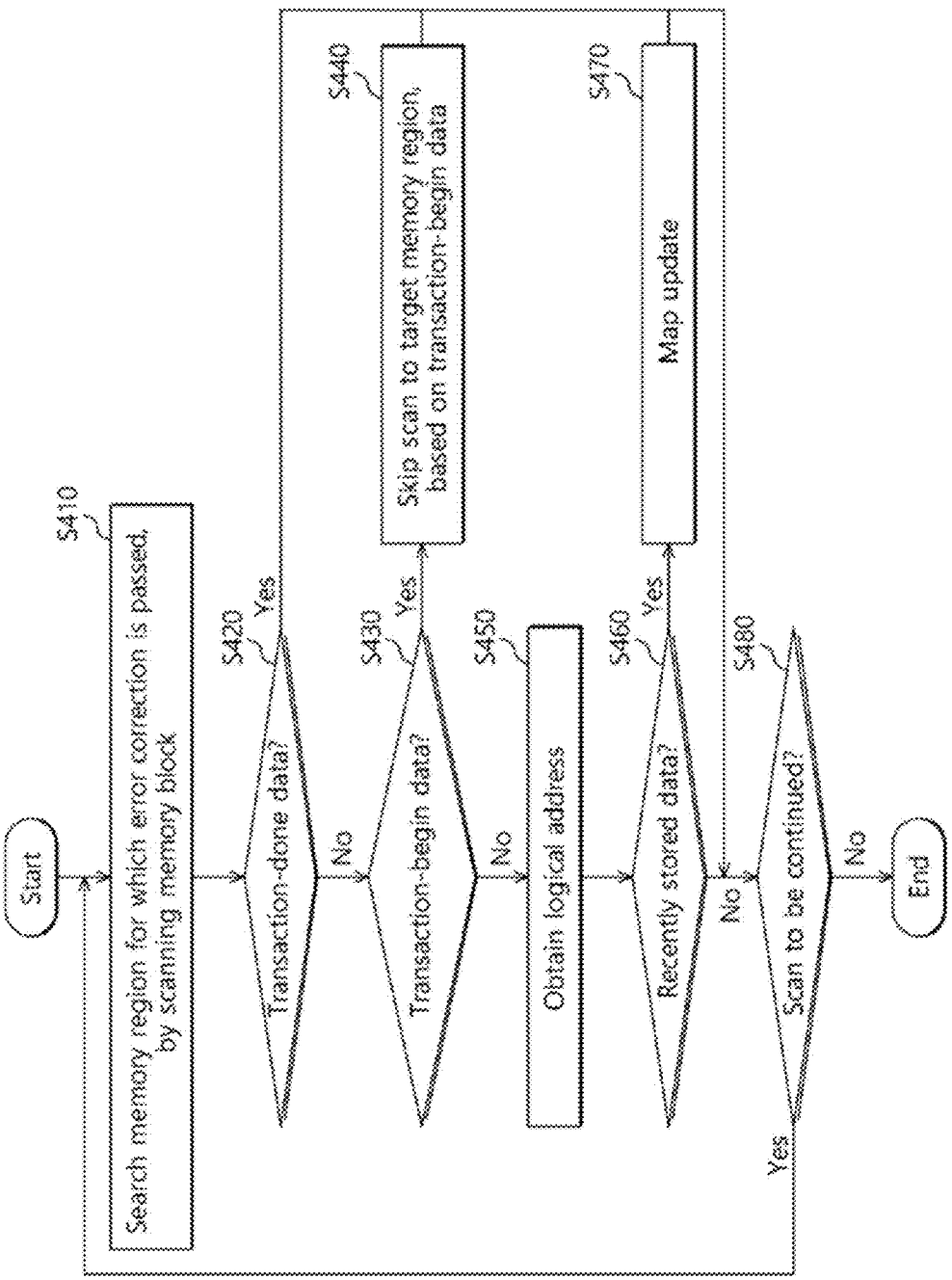
FIG. 15 is a flow chart illustrating a map update method of a controller in accordance with an embodiment.

FIG. 15 is a flow chart illustrating a map update method of the controller 100 of FIG. 1 in accordance with the embodiment.

At step S410 the controller 100 may search a memory region for which error correction is passed, by scanning a memory block BK in a reverse order of a write sequence for the memory block BK.

At step S420 the controller 100 may determine whether transaction-done data is stored in the memory region. When it is determined that transaction-done data is stored in the memory region, since a map update is not needed, the process may proceed to step S480. When it is determined that transaction-done data is not stored in the memory region, the process may proceed to step S430.

At the step S430, the controller 100 may determine whether transaction-begin data is stored in the memory region. When it is determined that transaction-begin data is stored in the memory region, the process may proceed to step S440.

At the step S440, the controller 100 may determine a target memory region of a recovery operation based on the transaction-begin data, and skip the scan to the target memory region.

When it is determined at the step S430 that transaction-begin data is not stored in the memory region, the process may proceed to step S450. As a result, when it is determined that normal data is stored in the memory region, the process may proceed to the step S450.

At the step S450, the controller 100 ray obtain a logical address stored in the memory region.

At step S460, the controller 100 may determine whether data stored in the memory region is recently stored data, by checking a physical address mapped to the obtained logical address in a map table. That is, when the logical address has been mapped already to a certain memory region of the memory block BK in the map table, the controller 100 may determine that data stored in the memory region is not recently stored data. When it is determined that data stored in the memory region is recently stored data, the process may proceed to step S470.

At the step S470, the controller 100 may perform a map update by mapping the physical address of the memory region to the obtained logical address in the map table.

When it is determined at the step S460 that data stored in the memory region is not recently stored data, the process may proceed to the step S480.

At the step S480, the controller 100 may determine whether to continue to scan the memory block BK in the reverse order of the write sequence for the memory block BK. The controller 100 may end the process when a scan is performed to an initial memory region of the write sequence in the memory block BK and thereby the map update is completed. The controller 100 may determine to continue to perform the scan, when a memory region: is left to scan, and the process may proceed to the step S410.

Figure 16:
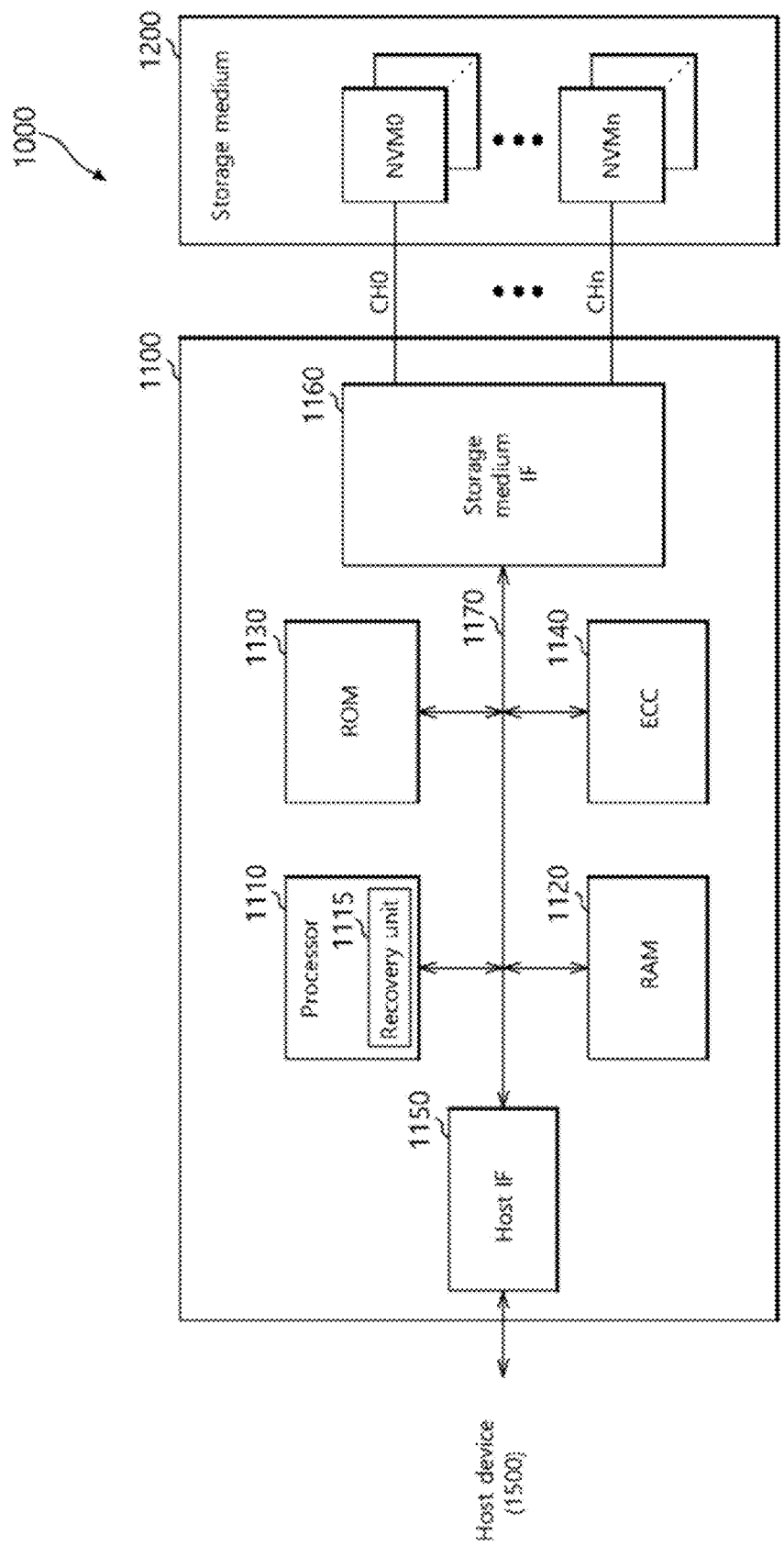
FIG. 16 is a block diagram illustrating a solid state drive (SSD) in accordance with an embodiment.

FIG. 16 is a block diagram illustrating a solid state drive (SSD) 1000 in accordance with an embodiment.

The SSD 1000 may include a controller 1100 and a storage medium 1200.

The controller 1100 may control data exchange between a host device 1500 and the storage medium 1200. The controller 1100 may include a processor 1110, a random access memory (RAM) 1120, a read only memory (ROM) 1130, an error correction code (ECC) unit 1140, a host interface (IF) 1150 and a storage medium interface (IF) 1160 which are coupled through an internal bus 1170.

The processor 1110 may control general operations of the controller 1100. The processor 1110 may store data in the storage medium 1200 and read stored data from the storage medium 1200, according to data processing requests from the host device 1500. To efficiently manage the storage medium 1200, the processor 1110 may control internal operations of the SSD 1000 such as a merge operation, a wear leveling operation, and so forth.

The processor 1110 may include a recovery unit 1115. The recovery unit 1115 may operate in substantially the same manner as the recovery unit 110 of FIG. 1. The recovery unit 110 may search a memory region for which error correction is passed, by scanning sequentially a plurality of memory regions included in a memory block of the storage medium 1200, in a reverse order of a write sequence for the memory block determine a target memory region in the memory block based on the data stored in the memory regions, and perform a recovery operation for the target memory region in the memory block. When performing the recovery operation, the recovery unit 1115 may write dummy data in an initially erased memory region of the memory block, write transaction-begin data in a first subsequent memory region which is subsequent to the initially erased memory region in the write sequence for the memory block, copy the data stored in the target memory region to a second subsequent memory region which is subsequent to the first subsequent memory region in the write sequence, and write transaction-done data in a third subsequent memory region which is subsequent to the second subsequent memory region in the write sequence.

The RAM 1120 may store programs and program data to be used by the processor 1110. The RAM 1120 may temporarily store data received from the host interface 1150 before transferring it to the storage medium 1200, and may temporarily store data received from the storage medium 1200 before transferring it to the host device 1500.

The ROM 1130 may store program codes to be read by the processor 1110. The program codes may include commands to be processed by the processor 1110, for the processor 1110 to control the internal units of the controller 1100.

The ECC unit 1140 may encode data to be stored in the storage medium 1200, and may decode data read from the storage medium 1200. The ECC unit 1140 may detect and correct an error which occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may receive data from the storage medium 1200. The storage medium interface 1160 may be coupled with the storage medium 1200 through a plurality of channels CH0 to CHn.

The storage medium 1200 may include a plurality of nonvolatile memory devices NVM0 to NVMn. Each of the plurality of nonvolatile memory devices NVM0 to NVMn may perform a write operation and/or a read operation according to control of the controller 1100.

Figure 17:
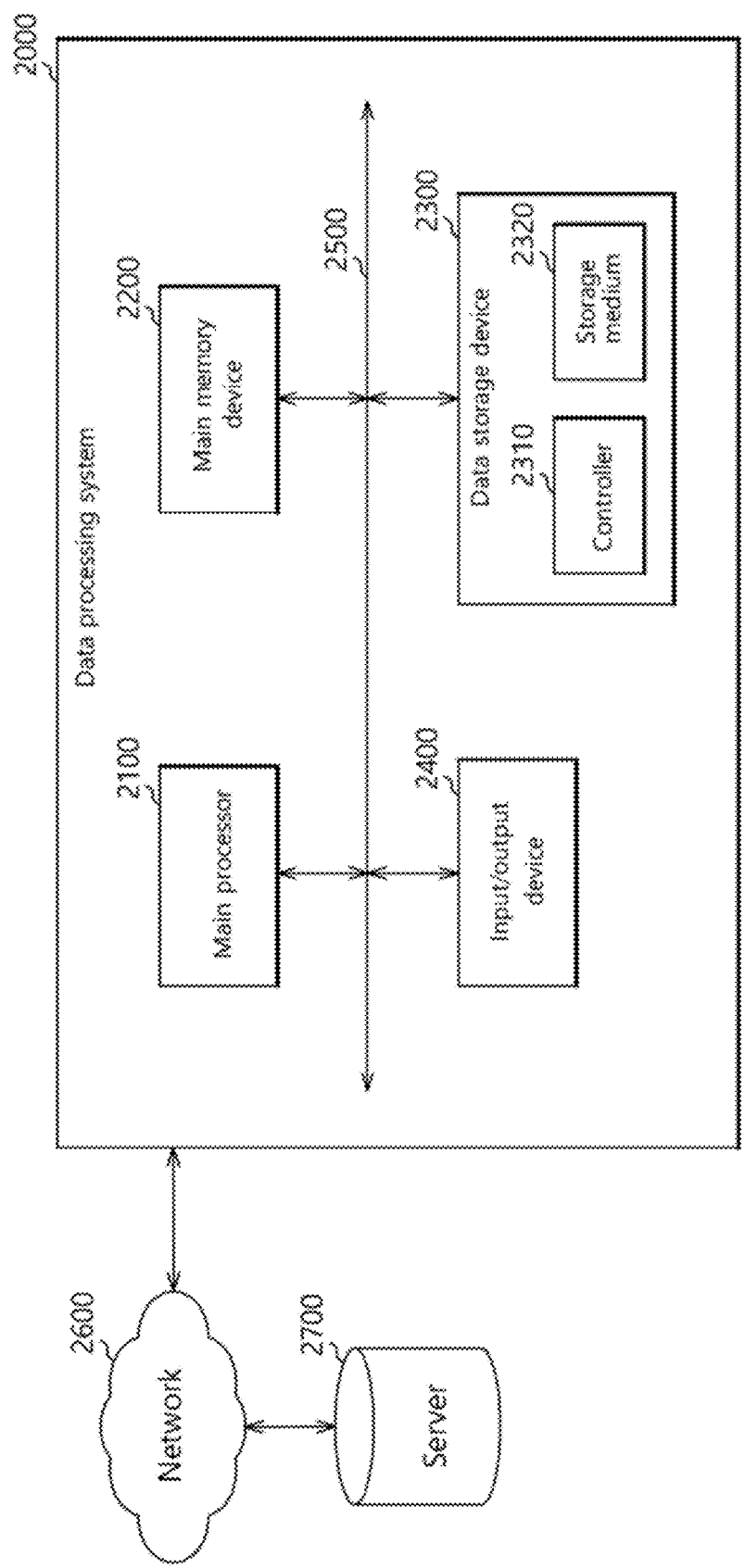
FIG. 17 is a block diagram illustrating a data processing system to which the data storage device in accordance with the embodiment is applied.

FIG. 17 is a block diagram illustrating a data processing system 2000 to which the data storage device 10 in accordance with the embodiment is applied.

The data processing system 2000 may include a computer, a laptop, a netbook, a smart phone, a digital television (TV), a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be a central processing unit, for example, such as a microprocessor. The main processor 2100 may execute software such as an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate substantially similarly to the data storage device 10 of FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a local area network (LAN), a wide area network (WAN), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments. It will be apparent to those skilled in the art to which the present invention pertains that various other changes and modifications may be made without departing from the spirit and scope of the invention as defined in the following claims.

What is claimed is:

1. A data storage device comprising:
    a nonvolatile memory device including a memory block having a plurality of memory regions; and
    a controller suitable for searching a first memory region for which error correction is passed, by scanning the plurality of memory regions in a reverse order of a write sequence for the memory block, determining a target memory region in the memory block based on data stored in the first memory region, and performing a recovery operation for the target memory region,
    wherein, when it is determined that transaction-begin data is stored in the first memory region, the controller determines a memory region which is indicated by the transaction-begin data, as the target memory region.

2. The data storage device according to claim 1, wherein the controller searches the first memory region by scanning the plurality of memory regions in the reverse order of the write sequence in response to a sudden power-off.

3. The data storage device according to claim 1, wherein the controller writes dummy data in an initially erased memory region of the memory block, writes the transaction-begin data in a first subsequent memory region which is subsequent to the initially erased memory region in the write sequence, copies data stored in the target memory region to a second subsequent memory region which is subsequent to the first subsequent memory region in the write sequence, and writes transaction-done data in a third subsequent memory region which is subsequent to the second subsequent memory region in the write sequence.

4. The data storage device according to claim 1, wherein the controller searches a memory region for which error correction is passed and which does not store dummy data, as the first memory region.

5. The data storage device according to claim 1, wherein, when it is determined that transaction-done data is stored in the first memory region, the controller completes the recovery operation by writing the transaction-done data in an initially erased memory region of the memory block.

6. The data storage device according to claim 1, wherein, when it is determined that normal data is stored in the first memory region, the controller searches a second memory region for which error correction is passed, by continuously performing a scan in the reverse order of the write sequence, and determines the target memory region based on data stored in the second memory region.

7. The data storage device according to claim 6, wherein, when it is determined that transaction-begin data is stored in the second memory region, the controller determines the memory region which is indicated by the transaction-begin data stored in the second memory region, as the target memory region, and, when it is determined that the transaction-begin data is not stored in the second memory region, the controller determines the first memory region as the target memory region.

8. The data storage device according to claim 1, wherein the controller searches a third memory region for which error correction is passed, by scanning the plurality of memory regions in the reverse order of the write sequence for a map update, obtains a logical address stored in the third memory region when it is determined that normal data is stored in the third memory region, determines whether the normal data is recently stored data by referring to a physical address mapped to the logical address in a map table, and performs the map update depending on a determination result.

9. The data storage device according to claim 8, wherein, when it is determined that transaction-begin data is stored in the third memory region, the controller skips the scan to a memory region which is indicated by the transaction-begin data stored in the third memory region.

10. A method for operating a data storage device, comprising:
searching a first memory region for which error correction is passed by scanning a plurality of memory regions included in a memory block, in a reverse order of a write sequence for the memory block;
determining a target memory region in the memory block based on data stored in the first memory region; and
performing a recovery operation for the target memory region,
wherein the determining of the target memory region comprises:
when it is determined that transaction-begin data is stored in the first memory region, determining a memory region which is indicated by the transaction-begin data, as the target memory region.

11. The method according to claim 10, wherein the searching of the first memory region comprises:
searching the first memory region by scanning the plurality of memory regions included in the memory block, in the reverse order of the write sequence for the memory block in response to a sudden power-off.

12. The method according to claim 10, wherein the performing of the recovery operation comprises:
writing dummy data in an initially erased memory region of the memory block;
writing the transaction-begin data in a first subsequent memory region which is subsequent to the initially erased memory region in the write sequence;
copying data stored in the target memory region to a second subsequent memory region which is subsequent to the first subsequent memory region in the write sequence; and
writing transaction-done data in a third subsequent memory region which is subsequent to the second subsequent memory region in the write sequence.

13. The method according to claim 10, wherein the searching of the first memory region comprises:
searching a memory region for which error correction is passed and which does not store dummy data, as the first memory region.

14. The method according to claim 10, further comprising:
when it is determined that transaction-done data is stored in the first memory region, completing the recovery operation by writing the transaction-done data in an initially erased memory region of the memory block.

15. The method according to claim 10, wherein the determining of the target memory region comprises:
searching a second memory region for which error correction is passed, by continuously performing scan in the reverse order of the write sequence, when it is determined that normal data is stored in the first memory region; and
determining the target memory region based on data stored in the second memory region.

16. The method according to claim 15, wherein the determining of the target memory region comprises:
when it is determined that the transaction-begin data is stored in the second memory region, determining a memory region which is indicated by the transaction-begin data stored in the second memory region, as the target memory region; and
determining the first memory region as the target memory region, when it is determined that the transaction-begin data is not stored in the second memory region.

17. The method according to claim 10, further comprising:
searching a third memory region for which error correction is passed, by scanning the plurality of memory regions in the reverse order of the write sequence for a map update;
obtaining a logical address stored in the third memory region when it is determined that normal data is stored in the third memory region;
determining whether the normal data is recently stored data, by referring to a physical address mapped to the logical address in a map table; and
performing the map update depending on a determination result.

18. The method according to claim 17, further comprising:
when it is determined that transaction-begin data is stored in the third memory region, skipping the scan to a memory region which is indicated by the transaction-begin data stored in the third memory region.

* * * * *